(12) United States Patent
Mas et al.

(10) Patent No.: US 12,081,888 B2
(45) Date of Patent: Sep. 3, 2024

(54) READING CIRCUIT FOR A PIXEL ARRAY

(71) Applicant: STMicroelectronics (Grenoble 2) SAS, Grenoble (FR)

(72) Inventors: Alexandre Mas, Montbonnot St Martin (FR); Abdessamed Mekki, Grenoble (FR); Cedric Tubert, Saint-Egreve (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 44 days.

(21) Appl. No.: 17/660,084

(22) Filed: Apr. 21, 2022

(65) Prior Publication Data

US 2022/0368847 A1 Nov. 17, 2022

(30) Foreign Application Priority Data

May 17, 2021 (FR) ...................... 2105114

(51) Int. Cl.
*H04N 25/75* (2023.01)
*H03M 1/12* (2006.01)
*H03M 1/46* (2006.01)
*H04N 25/625* (2023.01)
*H04N 25/677* (2023.01)

(52) U.S. Cl.
CPC .......... *H04N 25/75* (2023.01); *H03M 1/1245* (2013.01); *H03M 1/46* (2013.01); *H04N 25/625* (2023.01); *H04N 25/677* (2023.01)

(58) Field of Classification Search
CPC .... H04N 25/75; H04N 25/625; H04N 25/677; H03M 1/1245; H03M 1/46
See application file for complete search history.

(56) References Cited

U.S. PATENT DOCUMENTS

2008/0094271 A1 4/2008 Tooyama et al.
2021/0105422 A1* 4/2021 Tsai ...................... H03M 1/466

OTHER PUBLICATIONS

Pastorelli, Cedric et al., "Piece-Wise-Linear Ramp ADS for CMOS Image Sensor and Calibration Techniques", STMicroelectronics, Grenoble, France, Computer Science, Jun. 8, 2015, 4 pages.

* cited by examiner

*Primary Examiner* — Twyler L Haskins
*Assistant Examiner* — Fayez A Bhuiyan
(74) *Attorney, Agent, or Firm* — Slater Matsil, LLP

(57) ABSTRACT

The present disclosure relates to a read-out circuit comprising N inputs configured to be connected to N respective outputs of a pixel array of an image sensor, with N being an integer strictly greater than 1; and N analog-to-digital converters organized in K groups, with K being an integer strictly greater than 1 and strictly less than N, and each having a first input coupled to a respective one of the N inputs and a second input. In each group, the second inputs of the analog-to-digital converters of the group are connected together, electrically decoupled from the second inputs of the analog-to-digital converters of the other groups, and configured to receive a first reference signal that is identical for all the analog-to-digital converters of the group.

21 Claims, 3 Drawing Sheets

READING CIRCUIT FOR A PIXEL ARRAY

CROSS-REFERENCE TO RELATED APPLICATIONS

This application claims the benefit of French Patent Application No. 2105114, filed on May 17, 2021, which application is hereby incorporated herein by reference.

TECHNICAL FIELD

The present disclosure relates to electronic circuits generally, and, more particularly, to read-out circuits for a pixel array of an image sensor.

BACKGROUND

A pixel array of an image sensor, such as a time-of-flight (TOF) sensor, comprises numerous pixels arranged in lines and columns.

Generally, when the array is read, i.e., when the pixels of the array are read, the rows of the pixels of the array are selected and read one after the other by a control circuit. All the pixels in the selected line are then read simultaneously, or, in other words, in parallel. For this, all the output signals of the pixels in the line being read are supplied simultaneously to outputs of the array, with these outputs connected to an array read-out circuit.

Known pixel array read-out circuits have various drawbacks.

SUMMARY

There is a need to overcome some or all of the drawbacks of known read-out circuit of a pixel array.

One embodiment addresses all or some of the drawbacks of known pixel array read-out circuits.

One embodiment provides a read-out circuit comprising N inputs configured to be connected to N respective outputs of a pixel array of an image sensor, with N being an integer strictly greater than 1, and N analog-to-digital converters organized in K groups, with K being an integer strictly greater than 1 and strictly less than N, and each having a first input coupled to a respective one of the N inputs and a second input, wherein, in each group, the second inputs of the analog-to-digital converters of the group are connected to each other, electrically decoupled from the second inputs of the analog-to-digital converters of the other groups, and configured to receive an identical first reference signal for all the analog-to-digital converters of the group.

According to one embodiment, the circuit further comprises a first circuit configured to provide a second reference signal, and, for each group, a first buffer circuit configured to receive the second signal and to provide the first reference signal of the group to the second inputs of the analog-to-digital converters of the group.

According to one embodiment, for each group, the first buffer circuit configured to provide the first reference signal of the group comprises as many second buffer circuits as there are analog-to-digital converters in the group, the second buffer circuits of all the first buffer circuits preferably being identical to each other.

According to one embodiment, each second buffer circuit is a follower amplifier, implemented by a MOS transistor connected as a follower source, for example.

According to one embodiment, each group comprises at least two analog-to-digital converters and at most N/2 analog-to-digital converters.

According to one embodiment, at least K-1 groups among the K groups each have an equal number P of analog-to-digital converters, with P an integer strictly greater than 1.

According to one embodiment, the number P is between 10 and 20.

According to one embodiment, the number P is determined by a compromise between a column noise and a smear effect in an image provided by the sensor.

According to one embodiment, each analog-to-digital converter is of the single ramp type, preferably correlated double sampling.

According to one embodiment, the second reference signal is a voltage ramp, the first circuit comprising a digital-to-analog converter, for example, configured to provide the second signal.

According to one embodiment, each analog-to-digital converter comprises a comparator having a first input coupled to the second input of the analog-to-digital converter, and a second input coupled to the first input of the analog-to-digital converter.

According to one embodiment, each analog-to-digital converter comprises a counter configured to receive an output signal from the comparator of the analog-to-digital converter.

According to one embodiment, each analog-to-digital converter is of the successive approximation register type.

According to one embodiment, the second reference signal is a DC reference voltage.

According to one embodiment, each analog-to-digital converter comprises a digital-to-analog converter configured to receive the first reference signal received by the second input of the analog-to-digital converter.

Another embodiment provides for an image sensor comprising an array of the pixels organized in lines and columns and a read-out circuit as described, with the N inputs of the read-out circuit being connected to N respective pixel array outputs.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION OF ILLUSTRATIVE EMBODIMENTS

Like features have been designated by like references in the various figures. In particular, the structural and/or functional features that are common among the various embodiments may have the same references and may dispose identical structural, dimensional and material properties.

For the sake of clarity, only the operations and elements that are useful for an understanding of the embodiments described herein have been illustrated and described in detail. In particular, known pixels, known pixel arrays, known circuits for driving a pixel array, known methods for driving a pixel array, and known image sensors have not been detailed, as the described embodiments and variants are compatible with these known pixels, known arrays, known driving circuits, known driving methods, and, more generally, with known image sensors.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Figure 1:
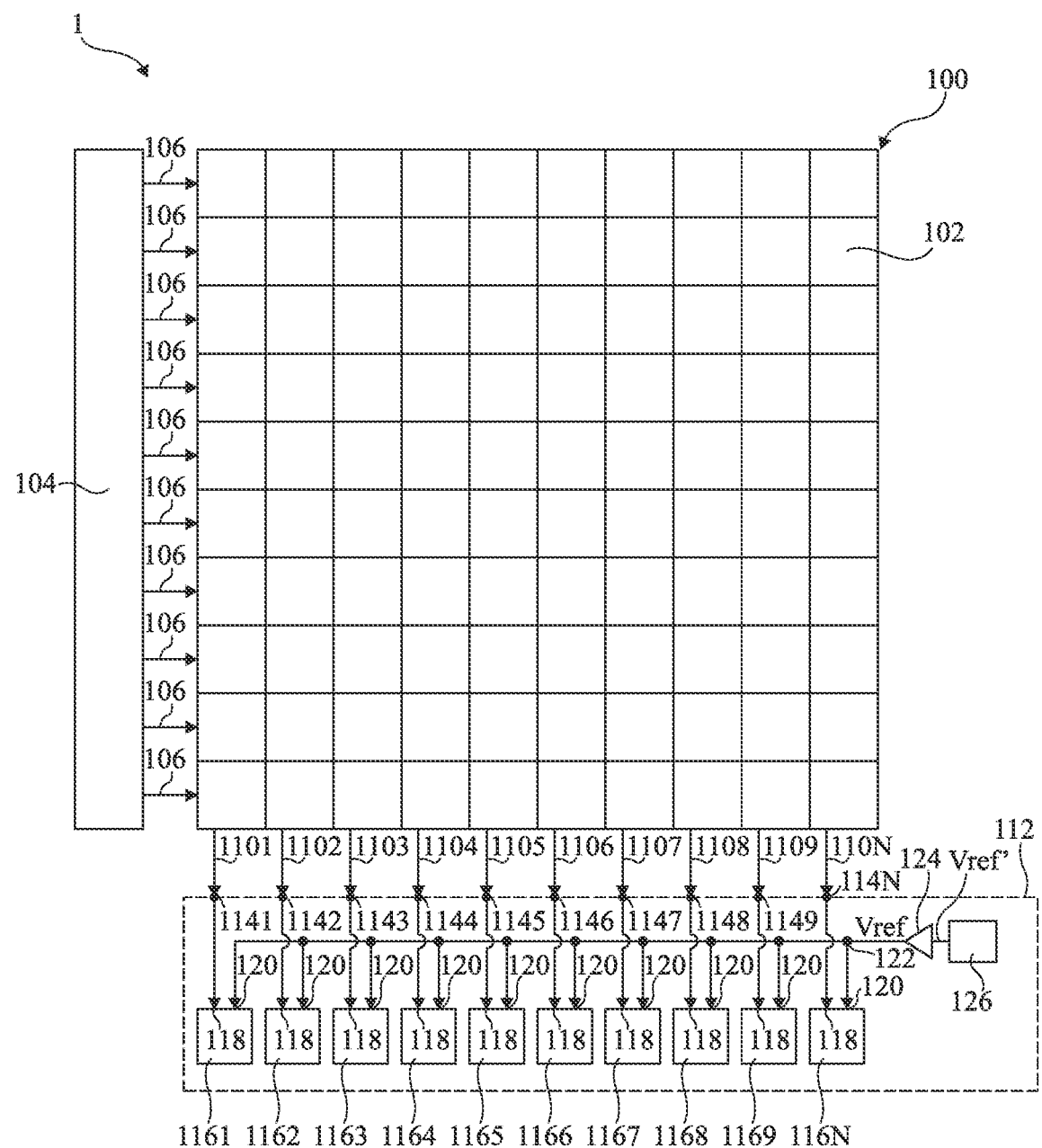
FIG. 1 shows an example of an image sensor, schematically and in block form.

FIG. 1 shows an example image sensor 1 of the type to which the described embodiments and variants apply, schematically and in block form.

The sensor 1 comprises an array boo of pixels 102, with a single pixel 102 referenced in FIG. 1. The pixels 102 in the array boo are arranged in lines (horizontal in FIG. 1) and columns (vertical in FIG. 1). In the example shown in FIG. 1, the array boo comprises 10 lines and 10 columns, although in other examples, not shown, the array 100 may comprise any number, such as more than 20 or even 100 columns and any number, such as more than 20 or even 100 lines.

Typically, the sensor 1 comprises a circuit 104 configured to provide control signals 106 for the array 100, or, in other words, the control signals 106 for the pixels 102.

In the example shown in FIG. 1, the circuit 104 is configured for each line, to provide the same control signals 106 to all the pixels in the line. However, in other examples not shown, the circuit 104 is configured for each line, to provide control signals 106 to at least some pixels in the line that are different from the control signals 106 provided to the other pixels in the line.

Further, in the example shown in FIG. 1, the control circuit 104 provides the signals 106 to the pixels 102 via a plurality of conductive lines (not shown) substantially parallel to the lines of the pixels 102. However, in other examples not shown, the circuit 104 is configured to provide the signals 106 to the pixels 102 via a plurality of conductive lines substantially parallel to the columns of the pixels 102, or via a plurality of conductive lines substantially parallel to the lines of the pixels 102 and a plurality of conductive lines substantially parallel to the columns of the pixels 102.

The array 100 comprises N outputs 110$i$ (1101 to 110N in FIG. 1), with N being an integer strictly greater than 1, greater than 20 or even greater than 100 for example, and i an integer ranging from 1 to N. During a phase of reading the array 100, the outputs 110$i$ are configured to provide output signals from the array, or, in other words, the output signals from the pixels 102. More particularly, the outputs 110$i$ are configured to simultaneously provide, or, in other words, in parallel, the output signals of a plurality of the pixels 102 of the array, of all the pixels 102 of a selected line, for example.

In the example shown in FIG. 1, the array 100 comprises one output 110$i$ per column and N is equal to 10, i.e., to the number of columns in the array 100. In other examples not shown, the array 102 comprises more than one output 110$i$ per column, such as two or even three outputs 110$i$ per column.

The sensor 1 comprises a read-out circuit 112, or, in other words, a circuit 112 configured to read the output signals of the array 100 of the pixels 102. Thus, the circuit 112 comprises N inputs 114$i$ (1141 through 114N in FIG. 1). The N inputs 114$i$ are connected to the N outputs 110$i$ of the array 100. In other words, each of the N inputs 114$i$ is connected to a corresponding output 110$i$. In other words, each of the N inputs 114$i$ is connected to a single output 110$i$, different from those to which the other inputs 114$i$ are connected. In the example shown in FIG. 1, the inputs 1141, 1142, 1143, 1144, 1145, 1146, 1147, 1148, 1149, 114N are connected to the outputs 1101, 1102, 1103, 1104, 1105, 1106, 1107, 1108, 1109, 110N respectively.

The circuit 112 further comprises N analog-to-digital converters (ADCs) 116$i$, referenced 1161 to 116N in FIG. 1. Preferably, the N converters 116$i$ are identical.

Each converter 116$i$ is configured to convert the analog signal provided by the corresponding output 110$i$ of the array 100 into a digital signal (not shown in FIG. 1). In other words, each converter 116$i$ is configured to convert the analog signal received by the corresponding input 114$i$ of the circuit 112 into a digital signal. The digital signals available at the output of the N converters 116$i$ are then received by a processing circuit (not shown in FIG. 1) of the sensor 1 configured to provide an image from these digital signals, for example. Thus, the N converters 116$i$ each have an input 118 configured to receive an analog signal to be converted. The input 118 of each converter 116$i$ is connected to the corresponding input 114$i$ of circuit 112. In the example shown in FIG. 1, the inputs 118 of the converters 1161, 1162, 1163, 1164, 1165, 1166, 1167, 1168, 1169, and 116N are thus connected to the respective inputs 1141, 1142, 1143, 1144, 1145, 1146, 1147, 1148, 1149, and 114N of the circuit 112.

Each converter 116$i$ further receives a reference signal that it uses to convert the analog signal it receives at its input 118 into a digital signal. Thus, the N converters 116$i$ each have an input 120 configured to receive a reference signal. In FIG. 1, the inputs 120 are connected to each other and thus all receive exactly the same reference signal Vref. The signal Vref is available at a node 122 to which the inputs 120 of all converters 116$i$ are connected.

In the example shown in FIG. 1, the Signal Vref is provided to the node 112 by a buffer circuit 124. The buffer circuit 124 is configured to receive a reference signal Vref' and to provide the signal Vref, such that the signal Vref evolves as the signal Vref'. The circuit 124 performs an impedance matching between a circuit 126, supplying it with the Vref' signal and the converters 116$i$, to which it supplies the signal Vref, with the output of the circuit 124 being connected to the node 122. As an example, the circuit 124 is a follower amplifier.

Because all the converters 116$i$ are connected to the same node 122, crosstalk occurs between the N converters 116$i$. This crosstalk is problematic, in particular because it is the source of artifacts in the image provided by the sensor 1.

For example, this crosstalk causes a smearing phenomenon, i.e., a white area of the image will tend to smear on a neighboring black area of this image.

For example, this crosstalk can also cause line noise when reading a given line of the pixels 102, with this noise being the same for all the pixels 102 in this line. Because this line noise is not constant between two different lines, it results in bands, such as horizontal bands, that are lighter or darker in the image provided by the sensor 1.

Figure 2:
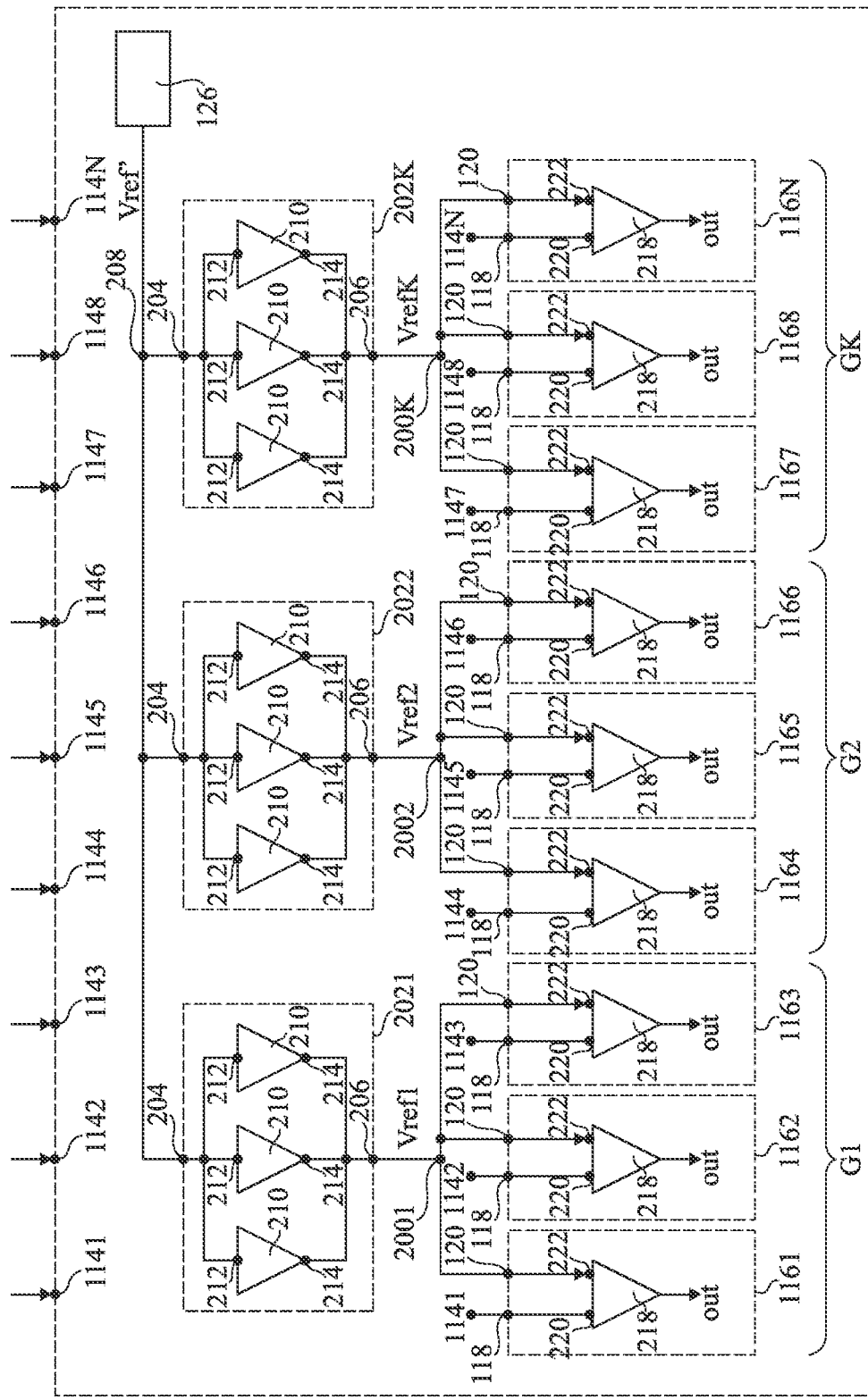
FIG. 2 shows one embodiment of a read-out circuit for a pixel array of an image sensor, schematically and partly in block form.

FIG. 2 shows one embodiment of a read-out circuit 2 of a pixel array, schematically and partially in block form. As an example, the circuit 2 is implemented in place of the circuit 112 in a sensor of the type described in connection with FIG. 1, in the sensor 1 of FIG. 1, for example.

Similar to the circuit 112 in FIG. 1, the circuit 2 comprises N inputs 114$i$ configured to be connected to N respective outputs 110$i$ of the array 100 (FIG. 1). In the example of FIG. 2, N is equal to 9 although, preferably, N is greater than 20 or even greater than 100. Thus, in the example of FIG. 2, the circuit 2 comprises 9 inputs, 1141 through 114N.

Further, like the read-out circuit 112 of FIG. 1, the circuit 2 comprises N analog-to-digital converters 116$i$ (1161 to 116N in FIG. 2), preferably identical, each comprising an input 118 connected to a corresponding input 114$i$ of the circuit 2 and an input 120 configured to receive a reference signal.

In the circuit 2, the N converters 116$i$ are organized into K groups Gj of converters 116$i$, with K being an integer strictly greater than 1 and strictly less than N, and j an integer ranging from 1 to K. In the example shown in FIG. 2, K is equal to 3 and the circuit 2 comprises 3 groups G1, G2, and GK.

Each converter 116$i$ belongs to only one of the groups Gj, or, in other words, each group Gj comprises converters 116$i$ distinct from those in the other groups Gj. Preferably, each group Gj comprises more than one converter 116$i$. Preferably, each group Gj comprises a number of converters 116$i$ between 2 and N/2.

Preferably, each group Gj comprises an equal number P of converters 116$i$. However, depending on the value of the number N of inputs 110$i$ and the value of P, this may not be possible. In the latter case, preferably, K-1 groups Gj each have the same number P of converters 116$i$. Preferably, the only group Gj that does not have P converters has fewer than 2*P converters 116$i$.

As an example, in FIG. 2, P is equal to 3, with the group G1 comprising the converters 1161, 1162, and 1163, the group G2 comprising the converters 1164, 1665, and 1166, and the group GK comprising the converters 1167, 1168, and 116N.

Unlike in the circuit 112, where all the converters 116$i$ received the same reference signal Vref, in FIG. 2, in each group Gj, the converters 116$i$ in that group receive a single reference signal Vrefj that is distinct from the reference signals Vrefj received by the converters 116$i$ in the other groups Gj. In the example shown in FIG. 2, the converters 116$i$ in the group G1 receive the reference signal Vref1 at their inputs 120, the converters 116$i$ in the group G2 receive the signal Vref2 at their inputs 120, and the converters 116$i$ in the group GK receive the signal VrefK at their inputs 120.

Thus, in each group Gj, the inputs 120 of the converters 116$i$ of that group Gj are connected to each other, but are not connected to the inputs 120 of the converters 116$i$ of the other groups Gj, or, in other words, are electrically decoupled from the inputs 120 of the converters 116$i$ of the other groups Gj. In other words again, in each group Gj, the inputs 120 of the converters 116$i$ of that group Gj are connected to a single node 200$j$, and are not connected to the nodes 200$j$ of the other groups Gj. In the example shown in FIG. 2, the inputs 120 of the converters 1161, 1162, and 1163 of the group G1 are connected to the node 2001, the inputs 120 of the converters 1164, 1165, and 1166 of the group G2 are connected to the node 2002, and the inputs 120 of the converters 1167, 1168, and 116N of the group GK are connected to the node 200K.

Although distinct from each other, the signals Vrefj are all obtained from the same reference signal Vref'. As an example, as in the circuit 112, the signal Vref' is provided by the circuit 126, at a node 208 of the circuit 2, for example.

Indeed, the signals Vrefj are configured to be identical, at least in theory. However, since they are distinct from each other, a change in the value of one of the signals Vrefj available on the corresponding node 200$j$, due to the kickback effect caused by a converter 116$i$ connected to this node 200$j$, for example, does not result in a change in the value of the other signals Vrefj available on the other nodes 200$j$. As a result, in practice, the signal Vrefj of one group Gj may be different from the signal Vrefj of another group Gj.

Thus, when a signal Vrefj is modified, by an action on the corresponding node 200$j$ of the converters 116$i$ connected to that node 200$j$, for example, due to the rebound effect that that node 200$j$ experiences from the converters 116$i$ connected to that node 200$j$, for example, this modification of the signal Vrefj is not transmitted to the other signals Vrefj. As a result, there is no longer any line noise in the image provided by the sensor comprising the circuit 2.

According to one embodiment, for each group Gj of converters 116$i$, the circuit 2 comprises a buffer circuit 202$j$. In other words, for each group Gj of converters 116$i$, the converters 116$i$ of the group are related to the same circuit 202$j$, with this circuit 202$j$ being distinct from the circuits 202$j$ to which the converters 116$i$ of the other groups Gj are related. Thus, in the example shown in FIG. 2, the circuit 2 comprises three circuits 2021, 2022, and 202K, with the converters 1161, 1162, and 1163 of the group G1 being related to the circuit 2021, the converters 1164,1165, and 1166 of the group G2 being related to the circuit 2022, and the converters 1167, 1168, and 116N of the group GK being related to the circuit 202K.

For each group Gj, the corresponding circuit 202$j$ is configured to receive the signal Vref' and to supply the signal Vrefj to the inputs 120 of the converters 116$i$ of this group Gj, with this signal Vrefj being common, or identical, to all the converters 116$i$ of the group. As an example, each circuit 202$j$ has an input 204 configured to receive the signal Vref' and an output 206 configured to provide the corresponding signal Vrefj. For example, the inputs 204 of all the circuits 202$j$ are connected to the node 208 of the circuit 2, at which the signal Vref' provided by the circuit 126, for example, is available. For example, for each group Gj, the corresponding circuit 202$j$ has its output 206 connected to the corresponding node 200$j$, i.e., to the node 200$j$ to which the inputs 120 of the converters 116$i$ of that group Gj are connected.

As an example, each circuit 202$j$ is a follower amplifier. Preferably, the circuits 202$j$ related to the groups Gj that have the same number P of converters 116$i$ are identical. More particularly, each circuit 202$j$ is configured to provide an output drive, for example, that is matched to the number of converters 116$i$ that are connected to the output of that circuit 202$j$. For example, a circuit 202$j$ whose output 206 is connected to P identical converters 116$i$ has an output drive, or an output capacitance value, in other words, that will be P times greater than the output drive that this circuit 116*j* would have had if its output 206 had been connected to only one of these converters 116*i*.

According to one embodiment, each circuit 202*j* comprises at least one buffer circuit 210, and more particularly, as many circuits 210 as there are converters 116*i* in the corresponding group Gj. In the example shown in FIG. 2, each circuit 202*j* comprises three circuits 210. The circuits 210 are preferably identical to each other. For example, each circuit 210 is a follower amplifier, such as a source follower metal oxide semiconductor [MOS] transistor.

In each circuit 202*j*, the circuits 210 are connected in parallel, between the input 204 and the output 206 of the circuit 202*j* to which they belong. In other words, each circuit 210 has an input 212 connected to the input 204 of the circuit 202*j* to which it belongs, and an output 214 connected to the output 206 of the circuit 202*j* to which it belongs.

According to one embodiment illustrated in FIG. 2, each converter 116*i* is of the single ramp type. In other words, according to one embodiment, each converter 116*i* comprises a comparator 218, such as a comparator-mounted operational amplifier, having an input 220 coupled to the input 118 of the converter 116*i*, and an input 222 coupled to the input 120 of the converter 116*i*.

Each comparator 218 is configured to provide a binary output signal 'out', a first binary state of which indicates that the voltage at the input 220 of the comparator is greater than that at its input 222, and a second binary state of which indicates that the voltage at the input 220 of the comparator 218 is less than that at its input 222.

Although not illustrated in FIG. 2, each converter 116*i* further comprises a counter, controlled at least in part by the output signal 'out' of the comparator 218 of the converter 116*i*. In other words, the counter is configured to receive this out signal.

Further, when the converters 116*i* are of the single ramp type, the signal Vref' is a voltage ramp. The circuit 126 is then configured to provide this voltage ramp Vref' and then comprises a digital-to-analog converter (DAC), for example, with this DAC being configured to provide the signal Vref'.

As an example, the operation of a single ramp type of converter 116*i* is as follows. When a pixel output signal is present at the input 118 of the converter 116*i*, a voltage ramp Vref' is provided to the node 208, whereby the input 120 of the converter 116*i* receives a corresponding voltage ramp Vrefj. The counter controlled by the out signal from the comparator 218 of the converter 116*i* counts as long as the out signal is in a first binary state, at the same frequency as that at which digital control codes are provided to the DAC of the circuit 126, for example, and stops when the out signal switches. The counter output is then stored and constitutes the digital signal corresponding to the analog pixel output signal, for example.

According to one embodiment, each single ramp converter 116*i* is also of the correlated double sampling (CDS) type. In other words, the correlated double sampling function is implemented directly by the converter 116*i*, in its counter, for example.

As an example, the operation of a correlated double sampling single ramp converter 116*i* is as follows. In a first phase, a pixel reference signal is available at the input 118 of the converter 116*i*. A first voltage ramp Vref', decreasing, for example, is then provided to the node 208. The duration of this first ramp is known, from which it follows that the value N1 that the counter would provide if it counted for the entire duration of this first ramp is known. Under the control of the out signal, the counter begins to count when the first ramp crosses the voltage on the converter input 118, when it becomes less than the voltage on the converter input 118, for example. The counter stops counting at the end of the first ramp. When the counter stops counting, the counter value is then equal to a value Nref=N1−N1', where N1' is the value the counter would have provided if it had been counting from the beginning of the first ramp until the moment the first ramp crosses the voltage on the input 118 of the converter 116*i*. In a second phase, the pixel output signal is provided at the input 118 of the converter 116*i*, with this output signal value depending on the amount of light received by the pixel in a previous integration phase. A second ramp Vref', with the same slope as the first voltage ramp Vref' for example, is then provided to the node 208. The counter begins counting at the start of this second ramp, starting at the value Nref, and stops when the second Vref' ramp passes the voltage on the input 118 of the converter 116*i*. At this moment, the value of the counter is equal to Nref+N2', with N2' the value that the counter would have had at the moment when the second Vref' ramp passes the voltage on the input 118 if the counter had been reset at the beginning of the second ramp Vref'. Since the value N1 is known, one can easily subtract the value N1 from the value Nref+N2' and obtain a value N2'−N1', which is the result of the implementation of correlated double sampling when reading the pixel. This operation is described in the thesis "Design of a piecewise ramped analog-digital converter for image sensor with calibration techniques" by Cedric Pastorelli, for example, in relation to FIGS. 45 and 47 of this thesis.

Although N is equal to 9 in the example of FIG. 2, a pixel array in practice comprises a number N of outputs much higher than 9, higher than 20 for example, preferably higher than 100.

According to one embodiment, the number P of converters 116*i* per group Gj, or, in other words, the number K of groups Gj, is chosen according to a compromise between the column noise and the smear effect observed in the image provided by the sensor comprising the circuit 2. Indeed, the smaller the number P is, the more the smear effect resulting from the crosstalk between the converters 116*i* of a given group Gj will be spatially limited in the image provided by the sensor, or even invisible to the human eye. However, the smaller the number P, the more column noise will be significant and perceptible as compared to the other noise present in the image obtained, with this column noise related to the output capacitance value of the buffer circuit 202*j* of this group Gj, for example. Conversely, the greater the number P, the more the smear effect resulting from the crosstalk between the converters 116*i* of a given group Gj will be spatially extended in the image provided by the sensor, or even visible to the human eye. However, the greater the number P, the lower the column noise will be, or even less perceptible it will be as compared to the other noise present in the image obtained.

For example, the number P is between 10 and 20, which makes it possible to have a smear effect imperceptible to the human eye in the image provided by the sensor, and a column noise imperceptible as compared to the other noises in the image provided by the sensor, for example.

As an example, in an indirect time-of-flight (iTOF) sensor comprising an array of 1280 columns, each having a single output 110*i* (FIG. 1), i.e., N is equal to 1280, the number P is chosen as equal to 16, for example, which implies that the number K of groups Gj is equal to 80. The choice of the number P, and thus the number K, is within the ability of those skilled in the art and depends on the implementation of the image sensor comprising the circuit 2, in particular on the various noise sources of this sensor.

Rather than organizing the converters 116i into K groups Gj as just described in relation to FIG. 2, one could have thought of relating each converter 116i to a distinct buffer circuit 210 and not connecting the inputs 120 of these converters to each other. However, this would have led to a significant increase in column noise. This is undesirable because this noise would have been different from column to column, and the image provided by the sensor would then have had vertical bands that were brighter or darker than neighboring bands, and this difference in brightness between neighboring bands would have been visible to the human eye, for example, or would have been the dominant noise in the image provided by the sensor, for example.

A particular example of one embodiment in which the converters 116i are of the single ramp type has been described above in connection with FIG. 2. However, the present description applies to other types of analog-to-digital converters 116i configured to receive a reference signal that is theoretically identical for all converters 116i. For example, the present description applies to successive approximation register (SAR) analog-to-digital converters, multiple-ramp single-slope (MRSS) analog-to-digital converters, chunk-ramp analog-to-digital converters, multiple-ramp multiple-slope analog-to-digital converters, or non-linear-ramp analog-to-digital converters. In particular, depending on the type of analog-to-digital converter 116i implemented, those skilled in the art are able to adapt the Vref signal, by correspondingly modifying the circuit 126 providing that Vref signal, for example.

Figure 3:
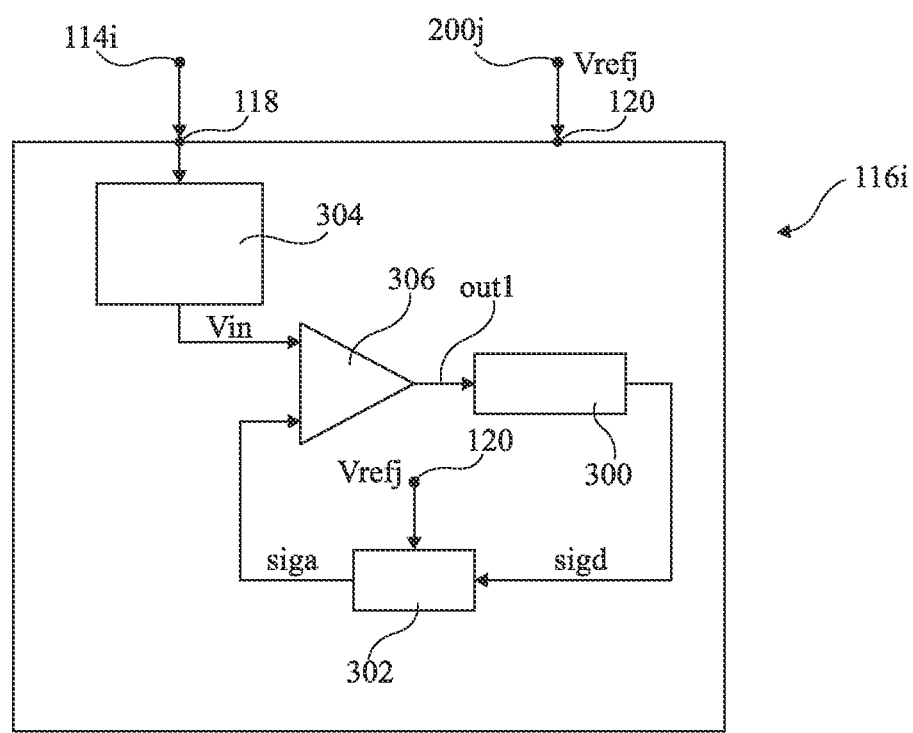
FIG. 3 shows an example of a variant embodiment of the read-out circuit of FIG. 2, schematically and partially in block form.

FIG. 3 illustrates an example of a variant embodiment of the circuit 2 of FIG. 2, wherein the single ramp type converters 116i described in connection with FIG. 2 are all replaced by successive approximation register type converters 116i. More particularly, FIG. 3 illustrates one such successive approximation register type converter 116i. Further, although not illustrated in FIG. 3, in one such variant, the signal Vref', provided by the circuit 126, for example is a DC reference voltage.

In this example, the successive approximation register type converter 116i includes a successive approximation register 300, a digital-to-analog converter 302, a circuit 304 and a comparator 306.

The circuit 304 is configured to receive the voltage from the input 118 of the converter 116i, which input 118 is connected to a corresponding input 114i of the circuit 2 (FIG. 2), to sample that received voltage, to provide a voltage Vin corresponding to that received voltage sample and to keep the value of the voltage Vin constant. In other words, the circuit 304 is configured to sample and hold the voltage it receives, and to provide the voltage Vin that corresponds to the result of that sampling and holding.

The digital-to-analog converter 302 is configured to receive a digital control signal sigd, and to provide a corresponding analog signal siga, typically a voltage siga, with the value of the voltage siga being determined by the value of the digital signal sigd.

The converter 302 further receives the voltage Vrefj received by the input 120 of the converter 116i. In other words, the converter 302 comprises an input connected to the input 120 of the analog-to-digital converter 116i.

The comparator 306 is configured to receive and compare the voltages Vin and siga, and provide a binary signal out1 indicating whether the voltage Vin is greater than the voltage siga or not.

This signal out1 is received by the successive approximation register 300. The circuit 300 is configured to provide the signal sigd. Specifically, the circuit 300 periodically updates the signal sigd based on the signal out1 it receives.

The detailed operation of such an SAR-type converter 116i is well known to the person skilled in the art and will not be detailed here. In addition, other SAR-type analog-to-digital converter 116i architectures can be provided by the person skilled in the art.

Like the single-ramp type converters 116i described in connection with FIG. 2, the converter 116i of FIG. 3 uses the reference signal Vrefj that it receives at its input 120 to perform the analog-to-digital conversion of the signal that it receives at its input 118. Thus, like the single-ramp type converters 116i described in connection with FIG. 2, the converter 116i of FIG. 3 may undesirably disturb the value of the Vrefj signal it receives, by bounce effect, for example. Organizing the converters 116i into K groups of converters 116i, preferably so that at least K-1 groups comprise the same number P of converters 116i, prevents the disturbance of a signal Vrefj by a converter 116i from also disturbing all the other signals Vrefj by crosstalk. This makes it possible to reduce, or even eliminate, the smear effect in the image provided by the sensor that comprises the read-out circuit 2 (FIG. 2). According to one embodiment, the choice of the number P of converters 116i is implemented in the manner described above in connection with FIG. 2 based on a compromise between column noise and smear effect in the image provided by the sensor.

Various embodiments and variants have been described. Those skilled in the art will understand that certain features of these embodiments can be combined and other variants will readily occur to those skilled in the art.

Finally, the practical implementation of the embodiments and variants described herein is within the capabilities of those skilled in the art based on the functional description provided hereinabove. In particular, the choice of the number K and therefore of the number P so that, as compared to the noises present in the image, the smear effect is imperceptible to the human eye and the column noise remains imperceptible in the image provided by the sensor is within the scope of those skilled in the art from the functional indications given above.

What is claimed is:

1. A read-out circuit comprising:
   N inputs configured to be connected to N respective outputs of a pixel array of an image sensor, with N being an integer strictly greater than 1;
   N analog-to-digital converters organized in K groups, with K being an integer strictly greater than 1 and strictly less than N, and each having a first input coupled to a respective one of the N inputs and a second input, each analog-to-digital converter being a correlated double sampling-type converter,
   wherein, in each group, the second inputs of the analog-to-digital converters of the group are:
      connected to each other,
      electrically decoupled from the second inputs of the analog-to-digital converters of the other groups, and
      configured to receive an identical first reference signal for all the analog-to-digital converters of the group;
   a first circuit configured to provide a second reference signal; and
   for each group, a first buffer circuit configured to receive the second reference signal and to provide the first reference signal of the group to the second inputs of the analog-to-digital converters of the group, wherein the second reference signal is a voltage ramp, and the first circuit comprises a digital-to-analog converter configured to provide the second reference signal.

2. The read-out circuit according to claim 1, wherein, for each group, the first buffer circuit configured to provide the first reference signal of the group comprises as many second buffer circuits as there are analog-to-digital converters in the group.

3. The read-out circuit according to claim 1, wherein each group comprises at least two analog-to-digital converters and at most N/2 analog-to-digital converters.

4. The read-out circuit according to claim 1, wherein at least K-1 groups from among the K groups each have a same number P of analog-to-digital converters, with P an integer strictly greater than 1.

5. The read-out circuit according to claim 1, wherein each analog-to-digital converter comprises a comparator having a first input coupled to the second input of the analog-to-digital converter, and a second input coupled to the first input of the analog-to-digital converter.

6. An image sensor comprising:
an array of pixels organized in lines and columns; and
a read-out circuit comprising:
N inputs connected to N respective outputs of the array of pixels, with N being an integer strictly greater than 1;
N analog-to-digital converters organized in K groups, with K being an integer strictly greater than 1 and strictly less than N, and each having a first input coupled to a respective one of the N inputs and a second input, each analog-to-digital converter being a successive approximation register-type converter,
wherein, in each group, the second inputs of the analog-to-digital converters of the group are:
connected to each other,
electrically decoupled from the second inputs of the analog-to-digital converters of the other groups, and
configured to receive an identical first reference signal for all the analog-to-digital converters of the group;
a first circuit configured to provide a second reference signal; and
for each group, a first buffer circuit configured to receive the second reference signal and to provide the first reference signal of the group to the second inputs of the analog-to-digital converters of the group, wherein the second reference signal is a DC reference voltage.

7. The read-out circuit according to claim 2, wherein each second buffer circuit is a follower amplifier implemented by a metal-oxide-semiconductor (MOS) transistor connected as a follower source.

8. The read-out circuit according to claim 4, wherein the number P is between 10 and 20.

9. The read-out circuit according to claim 4, wherein the number P is determined by a compromise between column noise and smear effect in an image provided by the image sensor.

10. The read-out circuit according to claim 5, wherein each analog-to-digital converter comprises a counter configured to receive an output signal from the comparator of the analog-to-digital converter.

11. The image sensor according to claim 6, wherein, for each group, the first buffer circuit configured to provide the first reference signal of the group comprises as many second buffer circuits as there are analog-to-digital converters in the group.

12. The image sensor according to claim 6, wherein each group comprises at least two analog-to-digital converters and at most N/2 analog-to-digital converters.

13. The image sensor according to claim 6, wherein at least K-1 groups from among the K groups each have a same number P of analog-to-digital converters, with P an integer strictly greater than 1.

14. A read-out circuit comprising:
N inputs configured to be connected to N respective outputs of a pixel array of an image sensor, with N being an integer strictly greater than 1;
N analog-to-digital converters organized in K groups, with K being an integer strictly greater than 1 and strictly less than N, and each having a first input coupled to a respective one of the N inputs and a second input,
wherein, in each group, the second inputs of the analog-to-digital converters of the group are:
connected to each other,
electrically decoupled from the second inputs of the analog-to-digital converters of the other groups, and
configured to receive an identical first reference signal for all the analog-to-digital converters of the group;
a first circuit configured to provide a second reference signal; and
for each group, a respective buffer circuit configured to receive the second reference signal and to provide the first reference signal of the group to the second inputs of the analog-to-digital converters of the group, the respective buffer circuit comprising as many follower amplifiers as there are analog-to-digital converters in the group.

15. The read-out circuit of claim 14, wherein each follower amplifier is implemented by a metal-oxide-semiconductor (MOS) transistor connected as a follower source.

16. The read-out circuit according to claim 14, wherein each group comprises at least two analog-to-digital converters and at most N/2 analog-to-digital converters.

17. The read-out circuit according to claim 14, wherein at least K-1 groups from among the K groups each have a same number P of analog-to-digital converters, with P an integer strictly greater than 1.

18. The read-out circuit according to claim 14, wherein each analog-to-digital converter is a correlated double sampling-type converter.

19. The read-out circuit according to claim 14, wherein each analog-to-digital converter comprises a comparator having a first input coupled to the second input of the analog-to-digital converter.

20. The read-out circuit according to claim 17, wherein the number P is between 10 and 20.

21. The read-out circuit according to claim 17, wherein the number P is determined by a compromise between column noise and smear effect in an image provided by the image sensor.

* * * * *